(12) United States Patent
Hsiung

(10) Patent No.: US 7,301,759 B2
(45) Date of Patent: Nov. 27, 2007

(54) PORTABLE ELECTRONIC PRODUCT WITH A BRACKET

(75) Inventor: Chen Kuo Hsiung, Laguna (HK)

(73) Assignee: Silicon Electron Pyrimid Ltd., Kowloon (HK)

( * ) Notice: Subject to any disclaimer, the term of this patent is extended or adjusted under 35 U.S.C. 154(b) by 166 days.

(21) Appl. No.: 11/130,479

(22) Filed: May 16, 2005

(65) Prior Publication Data
US 2005/0263660 A1    Dec. 1, 2005

(30) Foreign Application Priority Data
May 26, 2004  (CN)  ............... 2004 2 0046158 U

(51) Int. Cl.
G06F 1/16    (2006.01)
H05K 1/16    (2006.01)
H05K 7/00    (2006.01)

(52) U.S. Cl. .................. 361/681; 361/683; 248/673; 248/676; 248/677; 248/188; 248/188.8; 248/447; 248/454; 248/917; 248/919; 248/920; 248/922; 248/923; 248/924; 248/407; 248/351; 248/354.1; 248/354.7; 40/748; 403/109.1; 403/329

(58) Field of Classification Search ............... 248/676, 248/673, 677, 188.8, 188, 447, 454, 919, 248/920, 922–924, 917, 407, 351, 354.1, 248/354.7; 40/748; 403/109.1, 109.2, 109.8, 403/329; 361/681, 683
See application file for complete search history.

(56) References Cited

U.S. PATENT DOCUMENTS

| | | | | |
|---|---|---|---|---|
| 2,569,622 A * | 10/1951 | Trainor | ........................ | 248/477 |
| 4,508,385 A * | 4/1985 | Bowman | ..................... | 297/341 |
| 5,462,380 A * | 10/1995 | Peek et al. | .................. | 403/329 |
| 5,695,249 A * | 12/1997 | Lotfi | ........................... | 297/353 |
| 5,735,577 A * | 4/1998 | Lin | ......................... | 297/411.36 |
| 5,927,673 A * | 7/1999 | Kurokawa et al. | ........... | 248/456 |
| 6,003,831 A * | 12/1999 | Coleman | ..................... | 248/688 |
| 6,651,943 B2 * | 11/2003 | Cho et al. | ................. | 348/122.1 |
| 6,672,558 B2 * | 1/2004 | Li | ................................ | 248/463 |
| 6,709,059 B1 * | 3/2004 | Cvek | ........................... | 297/353 |
| 7,011,285 B2 * | 3/2006 | Wang et al. | ................. | 248/673 |
| 7,036,787 B1 * | 5/2006 | Lin | ............................. | 248/676 |
| 7,150,440 B2 * | 12/2006 | Yuan | ........................ | 248/372.1 |
| 2004/0084588 A1 * | 5/2004 | Liu et al. | .................. | 248/291.1 |
| 2005/0001114 A1 * | 1/2005 | Ogawa | ........................ | 248/127 |

* cited by examiner

Primary Examiner—Carl D. Friedman
Assistant Examiner—Nkeisha J. Dumas
(74) Attorney, Agent, or Firm—Much Shelist

(57) ABSTRACT

A bracket assembly for a portable unit. The assembly is pivotally mounted to the back of the unit and includes a frame member secured to the pivotally mounted member. A cover assembly is releasably secured to the frame member and can be moved to various positions with respect thereto. The cover assembly includes a locking assembly for locking and unlocking the cover assembly relative to the frame member.

5 Claims, 4 Drawing Sheets

PORTABLE ELECTRONIC PRODUCT WITH A BRACKET

TECHNICAL DOMAIN

This utility model involves a Portable Electronic Product with a bracket, especially a kind of portable AV (Audio/Video) product having a bracket with an adjustable length so it can be adjusted to various positions.

TECHNICAL BACKGROUND

As the consumer electric products develop, the Portable Electronic Product with a display are widely used more and more, especially the portable AV (Audio/Video) products, such as the LCD, portable and visible DVD player, etc. For the consideration of the consumers' requirements for the multiple-angled displays, some portable electronic products will come with the bracket on the casing opposite to the display. Thus, when the bracket is propped up, the portable electronic product can sit on the desk or other supporting planes to make it more comfortable for the users to view the displays at comfortable angles. The folding of the bracket flush with the back of the unit make them more convenient to carry them about.

However, the brackets of the existing Portable Electronic Products cannot have the length of their brackets regulated and as a result, the supporting angle of the Portable Electronic Product cannot be changed to satisfy such demands from the consumers.

DESCRIPTION OF INVENTION

The purpose of this utility model is to provide a kind of Portable Electronic Product with a bracket wherein the length of its bracket can be adjusted and the lengths can be fixed in position so that the supporting angle of the Portable Electronic Product can be varied.

For the said purpose a novel embodiment of applicants invention comprises a Portable Electronic Product with a display casing and bracket. The bracket is composed of a connector that is assembled on the casing that includes an upholding part located away from the connection to the casing. When the bracket is propped up, the supporting end of the bracket can be deposited in different positions at various distances from the connector and can be secured in position to hold up the display in any number of relative positions.

As a further improvement, the present invention is particularly directed to a Portable Electronic Product with a bracket such as a portable DVD. The bracket is installed on the casing just opposite to the display and is pivotally connected to the casing. A sunken area is located on the side of the casing opposite to the display to hold the bracket flush with the casing when it is in a folded position.

As the further advancement, the novel bracket assembly consists of a main support, a cover assembly connected to the main support and including an elastic ear arrangement working together with the main support. Specifically, the said bracket has a connector pivotally connected to the casing, a framework fixed to the connector, a cover assembly on the framework and an elastic ear arrangement working together with the framework and cover assembly. There is an elongated opening defined within the framework, at least one side of which has a waved configuration defining various concavities. The supporting end of the cover assembly is located opposite the end of the cover assembly adjacent the connector. The elastic ear is made up with a connecting section fixed to the cover assembly and a locking section of the elastic ear working together with cavities defined by the framework. The cover is locked onto the framework after one of the various relative positions of the cover assembly supporting end is selected. The locking section of the elastic ear will be secured within the cavities defined by the elongated opening in the framework to firmly retain the bracket in the selected position.

As a further improvement, the bracket of this utility model also includes a slip key lock, which is made up of a slidable part located inside the cover assembly. The extending part of the key lock reaches out toward the elastic ear and an adjusting knob for moving the keylock between "locked" and "unlocked" position is secured to the slidable part. There is a slot defined by a cover that retains the knob exposed to the outside of the cover assembly that enables the knob to be adjusted from outside the cover body. The cover assembly of the bracket includes inter-assembled front and back covers fused together by ultrasonic pressure welding. The framework of the main support is made from a stainless plate embedded into the said connector with an injection and forming technique.

Compared to the existing technology, the present invention provides for multiple relative positions at different distances of the supporting ends of the bracket relative to the connector and thus, the length of the bracket for the portable electric product is adjustable. The cover assembly can be secured relative to the connector in different positions so as to make it possible for every length of the bracket to be fixed in position. Furthermore, the wavy locking structure defined by the framework makes it possible to adjust the portable electronic product into different angles. The bracket is very thin and will not impact the convenience to carry about when folded inside the sunken area of the casing.

Further advantages will be apparent by reference to the following attached drawings.

DETAILED DESCRIPTION OF THE DRAWINGS

Referring to FIGS. 1, 4, 6 and 7 there is illustrated a Portable Electronic Product that includes a display 8, casing 2 and bracket assembly 1. Bracket assembly 1 is shown as being pivotally mounted onto the casing 2 of a portable electric product, just opposite to the display 8. In this embodiment, the portable product refers to a kind of portable AV (Audio/Video) product, but it is applicable to other similar products.

Figure 1:
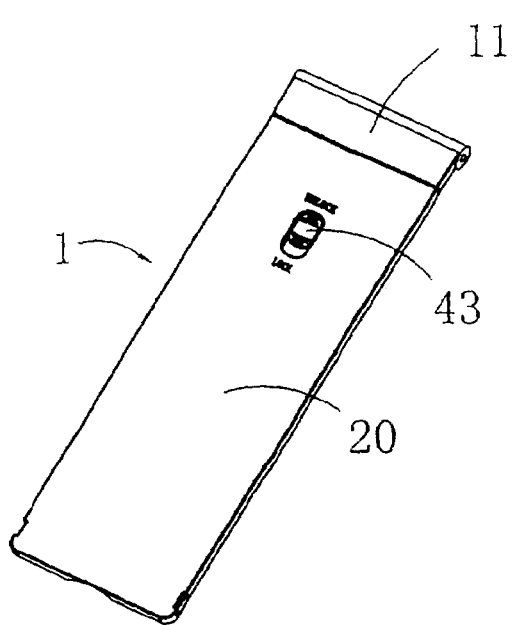
FIG. 1 shows a rear perspective view of the novel bracket assembly.
Figure 2:
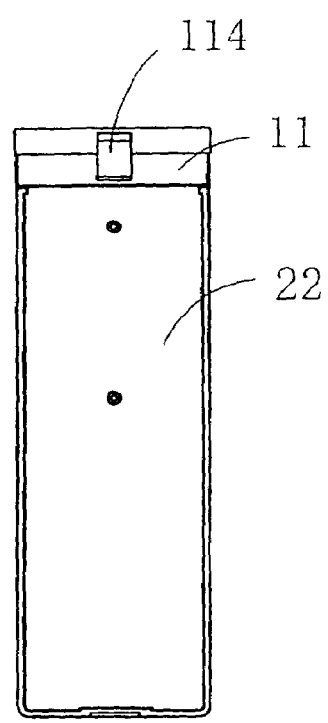
FIG. 2 shows the rear view of the bracket assembly.
Figure 3:
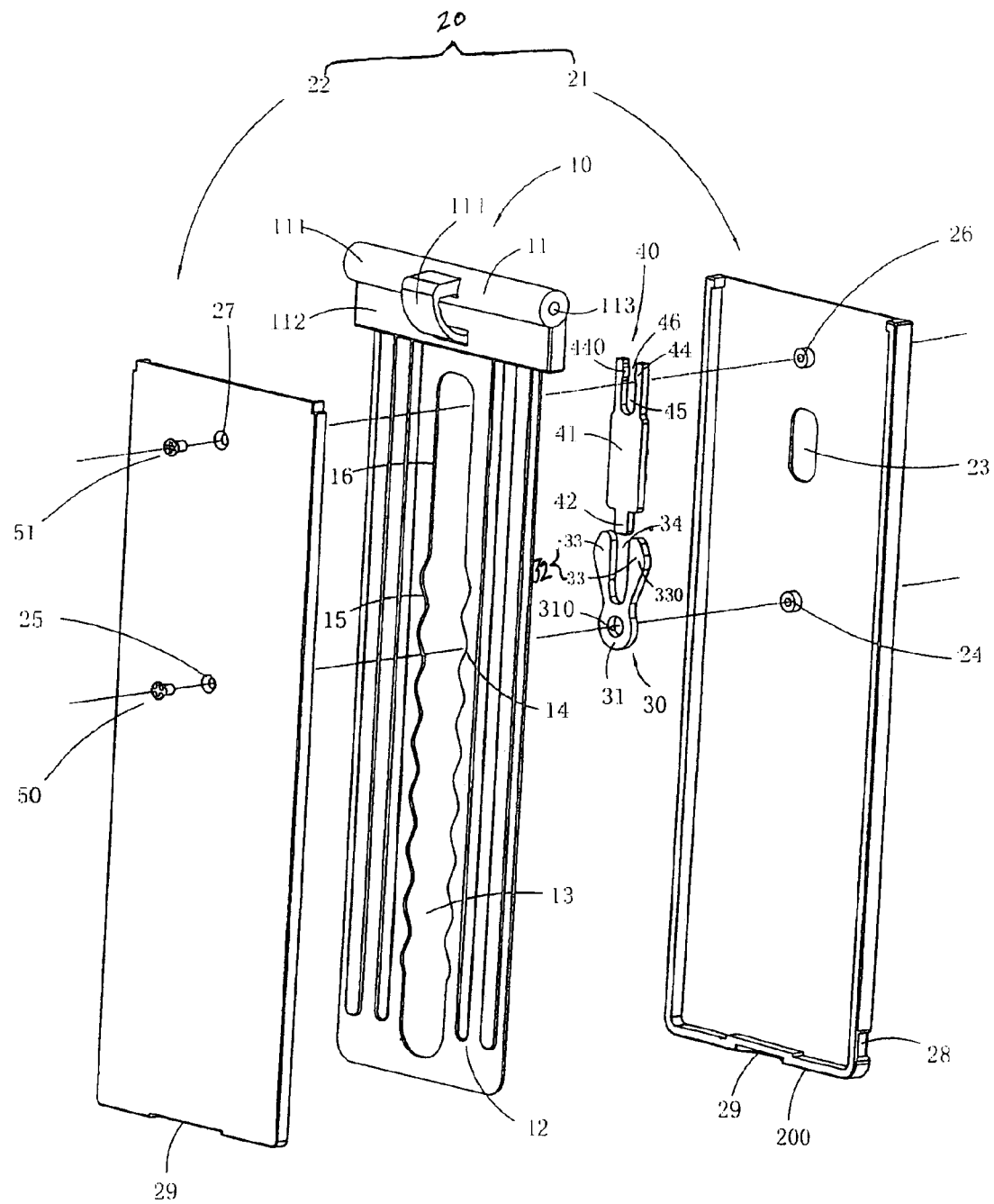
FIG. 3 shows a exploded perspective view of the bracket assembly.

With special reference to FIGS. 1, 2 and 3, the bracket assembly 1 includes a main support 10, a cover assembly 20 assembled on the main support 10, an elastic ear 30 working together with the cover assembly 20 and a slip key lock assembly 40.

The main support 10 includes a connector 11 assembled on the casing 2 and a framework 12 fixed to the connector 11.

Connector 11 includes a connecting panel 112 extending from cylinder pivot section 111. The cylindrical pivot section 111 has a cylindrical hole 113 and the pivot section 111 is connected to casing 2 via a pivot rod inside the hole 113 (not shown in the drawing, but generally made in metal). Of course the hole and rod arrangement is but one way of connecting the bracket to the casing. For example a pair of pivots extending outward from the two ends of the pivot section 111 adapted to be inserted into corresponding recesses in the casing can be used to connect the pivot section to casing 2. A resilient sustaining part 114 is also provided to support the bracket when the bracket is fitted into casing 2.

There is an elongated opening 13 located within the framework 12 and there are various sunken areas 14 in wavy shapes that define receiving cavities on at least one side of opening 13. In the illustrated embodiment, various wavy areas or cavities 14, 15 are formed on the both sides of opening 13.

In the illustrated embodiment, the connector 11 of the main support 10 is made of a plastic material, and the framework 12 of the main support 10 is made from a stainless steel plate punched and formed. Framework 12 is embedded into the connecting panel 112 of connector 11 via an injection and forming technique. Of course, in other embodiments, the connector 11 and main support 10 can also be injected and formed together from a plastic material with sufficient strength or in a metal material cast and formed with sufficient strength.

Elastic ear 30 serves as part of the adjustable connection between framework 12 and cover assembly 20 and includes a connecting section 31 fixed with the cover 21 and a locking section 330 working together with cavities 14, 15 in opening 13. There is a pin hole 310 set inside the connecting section 31. The locking section 330 includes a pair of elastic arms 33 extending upward from the connection section 31. There is a clearance opening 34 between arms 33 and there are projections extending from the arms 33 generally corresponding in shape with the cavities 14, 15 on the side located away from the clearance opening 34.

Slip key lock 40 includes a principal part 41 located inside the cover assembly 20, which includes a downwardly extending portion 42 toward the elastic ear 30. A knob 43 is connected to principal part 41 and there is a pair of elastic fingers 44 formed by the principal part 41 opposite from the extending part 42. There is a u-shaped opening 45 formed at the upper end of principal part 41 between the pair of elastic fingers 44. There are also a pair of protrusions 440 formed on the inside surface of the pair of elastic fingers 44. There is also a gap 46 located between the pair of protrusions 440, with the width of opening 45 being larger than gap 46.

Cover assembly 20 includes the inter-assembled front cover 21 and back cover 22, slip key lock 40 and an elastic ear member 30 clamped between the front cover 21 and back cover 22. In this embodiment, the front cover 21 and back cover 22 of the bracket are fused together by ultrasonic pressure welding. There is a slot 23 on the front cover 21 through which the knob 43 extends. This enables the knob 43 to be dialed from outside the cover 21. Further, the bottom of the cover assembly 20 is set far away from connector 11 to sustain the supporting end 200 on a desk. A skid proof component such as an inlay of rubber for the supporting an end of the cover assembly body 20 can be introduced to increase the friction between the supporting end 200 and the desk so as to provide a stable skid proof support.

Front cover 21 and back cover 22 are secured together with two self tapping screws 50 and 51 in this embodiment. There are two studs 24 and 26 with screw thread holes inside the interior surface of the front cover 21. There are two holes 25 and 27 on the back cover 22. Screws 50 and 51 are secured into the two studs 24 and 26 on front cover 21 after going through holes 25 and 27 on the back cover 22.

The studs 24 and 26 are set outside the two ends of the slot 23. Stud 24 is formed on the side far away from connector 11 of the main support 10 and near slot 23, while stud 26 is formed next to connector 11 of the main support 10 and near the slot 23. Pin hole 310 of the elastic ear 30 is matched with stud 24 so as to fix the elastic ear 30 to the front cover 21. Stud 26 is held inside opening 45 of the slip key lock 40, with the diameter of stud 26 being bigger than gap 46 of the slip key lock 40, and thus, blocked from coming out by the pair of protrusions 440 of the elastic fingers 44.

When the covers 21, 22, elastic ear 30 and slip key lock 40 are assembled onto the main support 10, the locking section 330 and connecting section 31 of the elastic ear 30 are located inside the cavities 14, 15 of the opening 13. The relative position of cover assembly 20 and main support 10 have two states, the locking state and unlocking state. When the cover assembly 20 is in the unlocking state relative to the main support 10, the locking section 330 of the elastic ear 30 can slide inside opening 13. This is permitted because the elastic ears are allowed to flex inwardly and define a width narrower than the narrowest width of the longitudinal opening 13. To move the cover assembly 20 into the locking state relative to the main support 10, the extending part 42 of the slip key lock 40 is moved by the knob 43 into the clearance opening 34 to extend the two elastic arms 33, outwardly. At that time, the width of the locking section 330 is bigger than the most narrowed width of the opening 13, but not bigger than the widest distance between the bottom of the cavities 14, 15. Therefore, after the two elastic arms 33 on the locking section 330 of the elastic ear 30 is expanded by elasticity by the slip lock 40 the projections on the arms 33 fit into opposed cavities 14, 15 to fix the locking action of the cover assembly 20 relative to the framework 12.

Corresponding knob 43 can be moved between the two positions inside the slot 23, which two positions correspond to the un-locking state when the cover assembly 20 can be moved relatively to the main support 10 and the locking state when the cover assembly 20 is fixed relative to the framework 12. In this embodiment there is provided a "LOCK" sign on the side of the locking position exterior surface of the front cover 21 below the slot 23; and there is provided an "UNLOCK" sign on the side of the exterior surface of the front cover 21 above the slot 23 to provide the identifying functions for the consumers.

Figure 4:
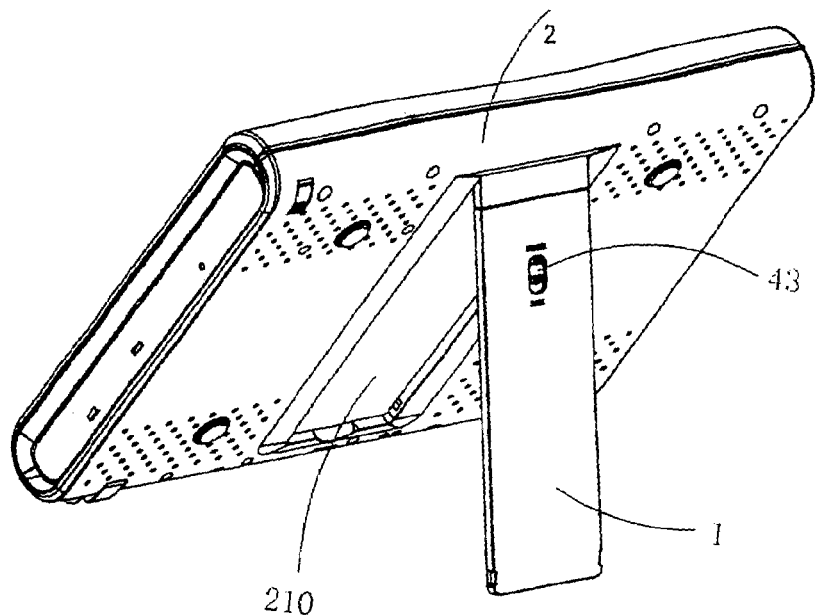
FIG. 4 shows a rear perspective of the Portable Electronic Product with the bracket assembly located in an initial supporting angle.
Figure 5:
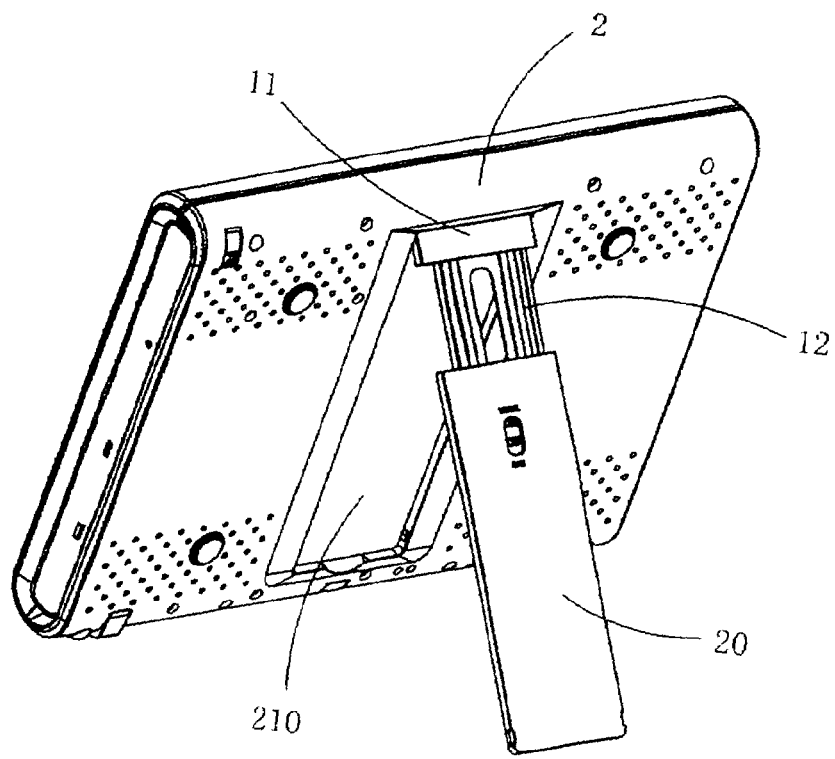
FIG. 5 shows a rear perspective view of the Portable Electronic Product with the bracket assembly shown in an extended position.
Figure 6:
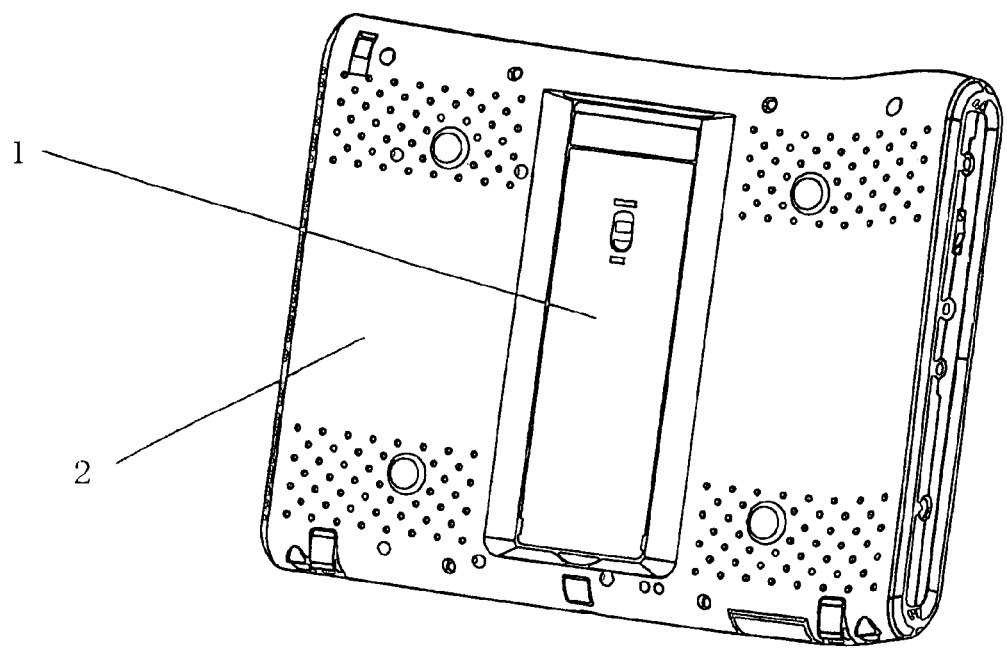
FIG. 6 shows a rear perspective view of the Portable Electronic Product with the bracket shown in a folded up position.
Figure 7:
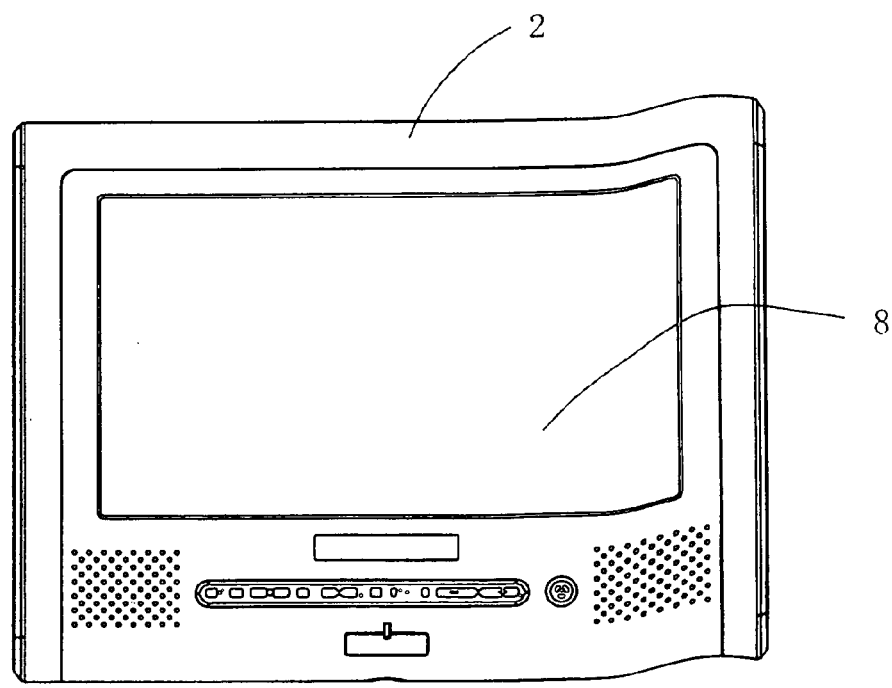
FIG. 7 shows a front view of Portable Electronic Product of FIG. 6.

Referring to FIGS. 4 and 5 especially FIG. 6, there is a concavity 210 formed on the casing just opposite to display 8. The entire construction of the bracket assembly I in this utility model is very thin so that it can be folded inside the concavity 210 when not used, thus making it easier to carry about. With further reference to FIGS. 3 and 5, a pair of slots 28 are formed on two sides of cover assembly 20 near the supporting end 200. These slots can work together with corresponding wedge stoppers (not marked) inside the concavity 210 of the portable product 2 to help secure the bracket assembly 1 inside the cavity.

A notch 29 can also be located at the supporting end 200 of the cover assembly 20 or the bottom of concavity 210 (not shown) to provide the finger space when the users wish to pull out the bracket assembly 1 away from the casing 2.

As shown in FIG. 4, after moving the bracket assembly 1 out of concavity 210, the users can seat the display 8 of the Portable Electronic Product on the desk at a certain angle. Then the cover body assembly 20 is spaced away from the connecting panel 112 of the main support 10. The principal part 41 of the slip key lock 40 is retained inside opening 16 of elongated opening 13. As shown in FIG. 5, if the visual angle is not comfortable and with the slip key lock 40 in the unlocked position the users can pull the cover assembly 20 downward further with the elastic ear 30 moving within the wavy positions or concavities 14, 15 within the elongated opening 13 as the cover assembly 20 moves. After pulling the cover assembly 20 to the desired location, the user can dial the knob 43 downward to the locking position (marked as "LOCK" in this embodiment). The slip key lock is moved down accordingly, with the extending part 42 being inserted into the clearance opening 34 between two elastic arms 33 to move the two elastic arms 33 to locate the locking section of elastic ear 30 securely inside the corresponding cavities 14, 15 located in the elongated opening 13 so as to realize the stepped adjustment of the bracket assembly 1. The supporting angles of the display 8 are wide because there are a number of cavities 14, 15 in elongated opening 13. In order to fold the bracket 1 assembly, just dial the knob 43 upward to the unlocking position (marked as "UNLOCK" in this embodiment), and then push the cover assembly 20 upward against connecting panel 112 and then restore it into concavity 210.

When the bracket assembly 1 is in the supporting state, the supporting end 200 of the bracket 1 is assembled to the connector 11 on the casing 2 with various relative positions at different distances. Every relative position corresponds to adjacent concavities 14, 15 of elongated opening 13 so that the length of the portable electric product can be adjusted step by step. The locking section 330 of elastic ear 30 can be secured inside every pair of concavities 14, 15 so as to make the supporting end 200 secured relative to the connector 11 in every relative position and so support the display 8. Thus every step of length to prop up the bracket assembly 1 can be secured at its set location.

Of course, the aforesaid embodiment is only a preferred one for this utility model. The utility model can also adopt other embodiments. For example, the bracket assembly 1 can also be equipped on the both sides of casing 2, only one side of elongated opening 13 can have the wavy concavities and the elastic ear 30 can have no protrusion on the elastic arm 33 on the side of the opening 13 where no concavities are provided. In this embodiment, the elastic ear 30 can also realize the gliding movement and locking process inside elongated opening 13. Further, the structures of the elastic ear 30 and slip key lock 40 can also be changed. For example, the slip key lock 40 can be eliminated and just change the elastic ear 30 into an elliptical configuration and control the elastic ear 30 by a knob set on the cover 21 to control the elastic ears to realize the gliding and locking functions inside the wavy openings 14, 15 of elongated opening 13.

Or alternatively, one can eliminate the slip key lock 40 and not control the gliding and locking functions with the knob 43, but directly realize the gliding and locking functions of elastic ear 30 inside the wavy trough by the folding and extending of the two elastic arms 33 of the elastic ear 30 to positively retain or release the elastic arms relative to the concavities 14, 15 defined by the elongated opening 13. Although, the effect of this embodiment is not better than the former it can also achieve the purpose of the novel arrangement for the stepped adjustment of the bracket assembly of this utility model.

It is intended that all modification and improvements are covered within the true spirit and scope of the invention as covered by the appended claims.

The invention claimed is:

1. A bracket assembly for a portable unit for supporting the unit in various positions, a first means for pivotally mounting the bracket assembly to the portable unit, a frame member having an opening with defined cavities along at least one side thereof for receiving an interlocking member, a cover assembly movably connected to said frame member, said cover assembly including a second means for movably interconnecting said cover assembly with said frame member in locking and unlocking engagement therewith, said second means including a slip key lock assembly including a principal part located inside the cover assembly and having a downwardly extending portion and a locking assembly positioned to fit into said cavities to lock the cover assembly to the frame member, said locking assembly including a central opening and deflectable portions surrounding said opening, which central opening is positioned to receive said downwardly extending portion to expand the deflectable portions into said cavities to lock the frame member into position relative to cover assembly and when the principal part is removed from said opening the deflectable portions will move out of said cavities to permit the cover assembly to be moved relative to said frame member.

2. A bracket assembly in accordance with claim 1 in which the deflectable portions are projections that are designed to fit into said cavities.

3. A bracket assembly for a portable unit for supporting the unit in various positions, first means for pivotally mounting the bracket assembly to the portable unit, a frame member secured to said pivotal mounting means, which frame member defines an opening defining a plurality of cavities on both sides of the opening, a cover assembly movably connected to said frame member and second means for controlling the position of said cover assembly relative to said frame member including means connected to said cover assembly that are positioned to be moved relative to said frame member, which connecting means includes at least one pivotally shaped member movable into and out of engagement with said cavities to facilitate movement of said cover assembly relative to said frame member which includes a resilient portion that defines a pair of projections that fit into cavities on both sides of the openings, third means for unlocking said connecting means member relative to said cavities to vary the position of said cover assembly in position in a new location, whereby the bracket assembly can be moved relative to said portable unit for positioning the portable unit at various angled positions.

4. A bracket assembly as set forth in claim 3 in which the means for locking the member in position relative to said cavities is a longitudinally extending member that is movably mounted relative to said cover assembly and defines a portion that fits into an opening defined between said projections to force the projections into engagement with said cavities to lock the cover assembly into position relative to said frame member.

5. A bracket assembly as set forth in claim 4 that includes a knob assembly connected to said longitudinally extending member that extends through an elongated slot defined by said cover assembly whereby the longitudinally extending member can be moved into and out of engagement with the opening defined between said projections to control the locking and unlocking of said member relative to said frame member.

* * * * *